US009383652B2

(12) United States Patent
Kajiyama et al.

(10) Patent No.: US 9,383,652 B2
(45) Date of Patent: Jul. 5, 2016

(54) LIGHT-EXPOSURE DEVICE

(75) Inventors: Koichi Kajiyama, Yokohama (JP);
Michinobu Mizumura, Yokohama (JP);
Makoto Hatanaka, Yokohama (JP)

(73) Assignee: V TECHNOLOGY CO., LTD.,
Yokohama-shi, Kanagawa (JP)

( * ) Notice: Subject to any disclaimer, the term of this patent is extended or adjusted under 35 U.S.C. 154(b) by 233 days.

(21) Appl. No.: 14/001,863

(22) PCT Filed: Feb. 2, 2012

(86) PCT No.: PCT/JP2012/052376
§ 371 (c)(1),
(2), (4) Date: Aug. 27, 2013

(87) PCT Pub. No.: WO2012/117801
PCT Pub. Date: Sep. 7, 2012

(65) Prior Publication Data
US 2013/0342820 A1    Dec. 26, 2013

(30) Foreign Application Priority Data

Mar. 2, 2011   (JP) ................ 2011-045576

(51) Int. Cl.
*G03B 27/42* (2006.01)
*G03F 7/20* (2006.01)
*G02B 3/00* (2006.01)

(52) U.S. Cl.
CPC ........ *G03F 7/70191* (2013.01); *G03F 7/70275* (2013.01); *G03F 7/70358* (2013.01); *G02B 3/0056* (2013.01)

(58) Field of Classification Search
CPC ..... G03F 7/20; G03F 7/2002; G03F 7/70116; G03F 7/2037; G03F 7/70058; G03F 7/70716; G03F 1/38; G03F 7/70141; G03F 1/22; G03F 7/70616; G03F 7/70625; G03F 7/707; G03F 7/70725; G03F 9/7003; G03F 9/7088
See application file for complete search history.

(56) References Cited

U.S. PATENT DOCUMENTS 5,912,726 A  *  6/1999  Toguchi et al. ................. 355/53
6,288,772 B1 *  9/2001  Shinozaki ........... G03F 7/70066
                                                          355/53

(Continued)

FOREIGN PATENT DOCUMENTS

JP    H08-055783 A    2/1996
JP    H09-244255 A    9/1997

(Continued)

OTHER PUBLICATIONS

Machine translation of JP 09244255 A.*
International Search Report (ISR) (PCT Form PCT/ISA/210) dated Mar. 19, 2012, in PCT/JP2012/052376.

*Primary Examiner* — Mesfin T Asfaw
(74) *Attorney, Agent, or Firm* — McGinn IP Law Group PLLC

(57) ABSTRACT

A light-exposure device is provided with a microlens array on which is arranged with a prescribed regularity a plurality of microlenses on which exposure light transmitted through a light source and a mask is introduced to resolve an upright equal-magnification image on a substrate. Upon reaching a prescribed position, the substrate is irradiated with pulsed laser light from the light source, and the substrate is successively exposed, and after the entire area of the exposure region of the substrate is exposed, a relative positional relationship between the microlens array and the mask is successively switched in a vertical direction by an amount of a horizontal pitch of the microlenses, and a subsequent exposure is performed. Exposure with high precision and high resolution can thereby be performed with a short exposure cycle time.

16 Claims, 14 Drawing Sheets

(56) References Cited

U.S. PATENT DOCUMENTS

| | | |
|---|---|---|
| 7,061,581 B1 | 6/2006 | de Jager |
| 7,218,380 B2 | 5/2007 | de Jager |
| 7,859,635 B2 | 12/2010 | Yokoyama et al. |
| 2004/0022503 A1* | 2/2004 | Okazaki ............... G02B 6/4249 385/96 |
| 2005/0024477 A1* | 2/2005 | Noguchi et al. ............. 347/241 |
| 2005/0151947 A1* | 7/2005 | Fujimaki ........................ 355/55 |

FOREIGN PATENT DOCUMENTS

| | | |
|---|---|---|
| JP | 2000-058422 A | 2/2000 |
| JP | 2004-335864 A | 11/2004 |
| JP | 2006-148123 A | 6/2006 |
| JP | 2006-235515 A | 9/2006 |
| JP | 2009-204982 A | 9/2009 |
| WO | WO 2005/038518 A1 | 4/2005 |

\* cited by examiner

FIG. 1
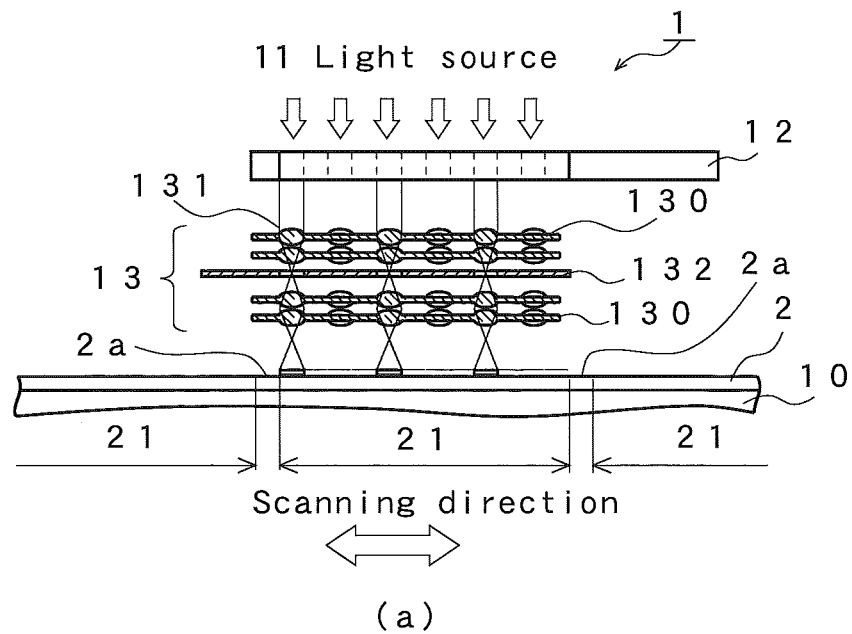
(a)
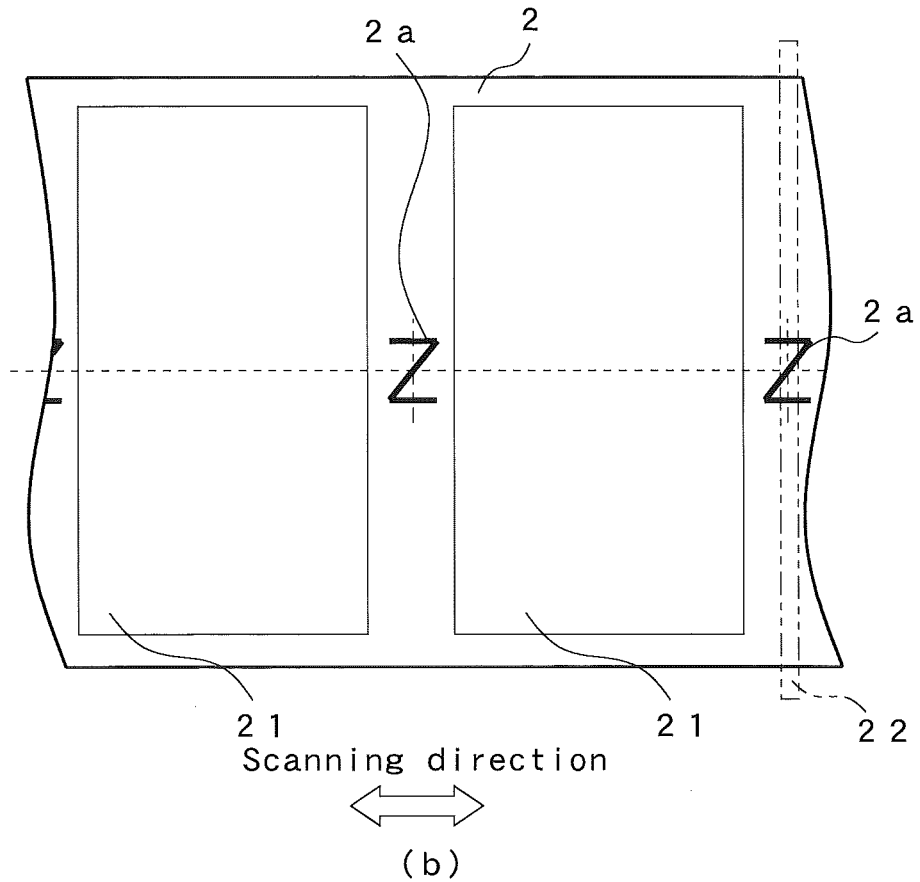
(b)

FIG. 2
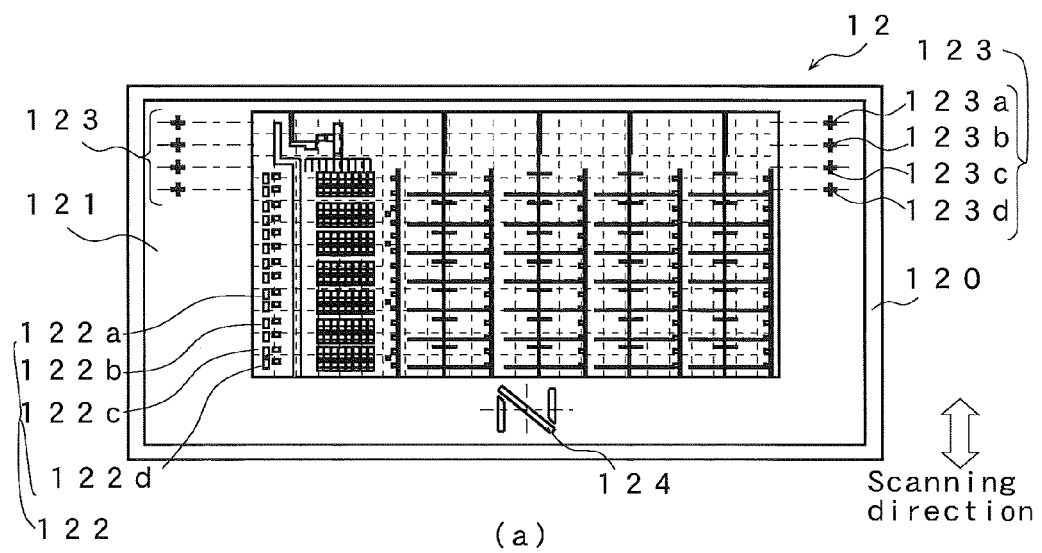
(a)
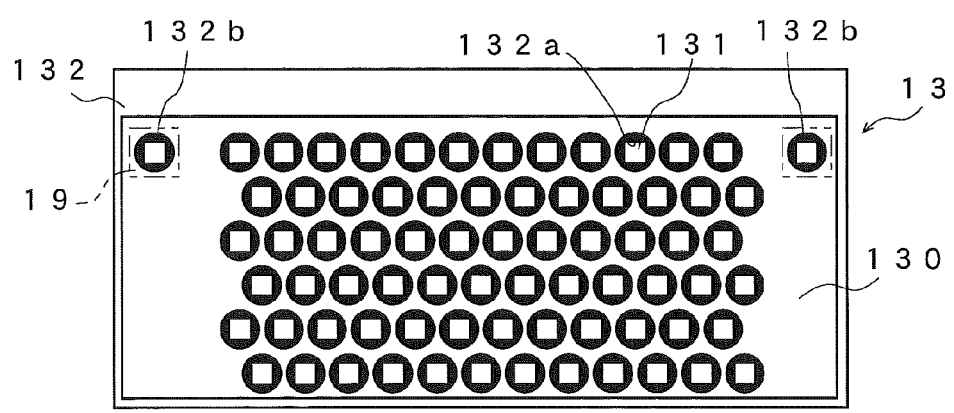
(b)

FIG. 6
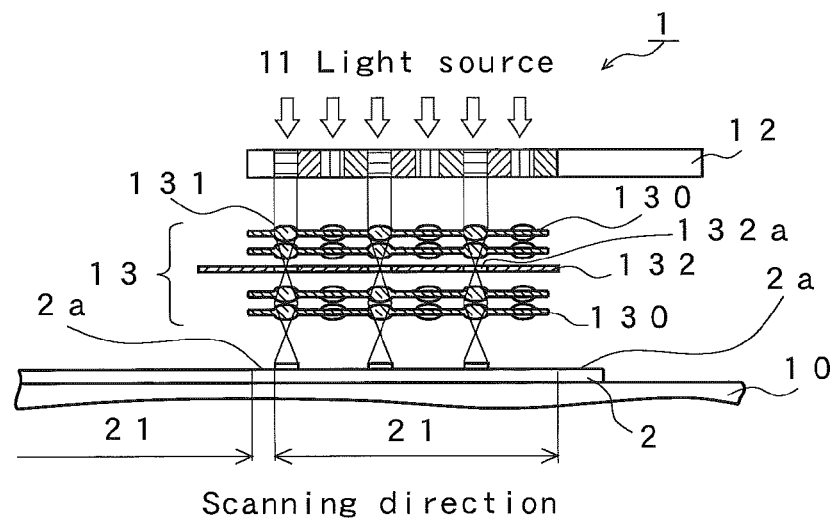
(a)
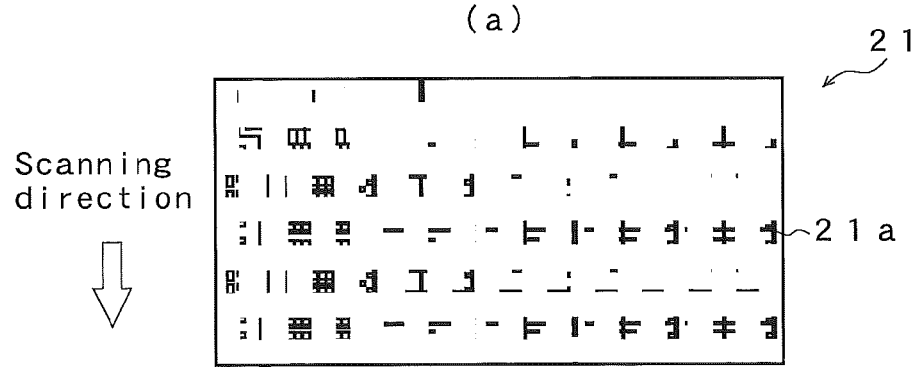
(b)

FIG. 8
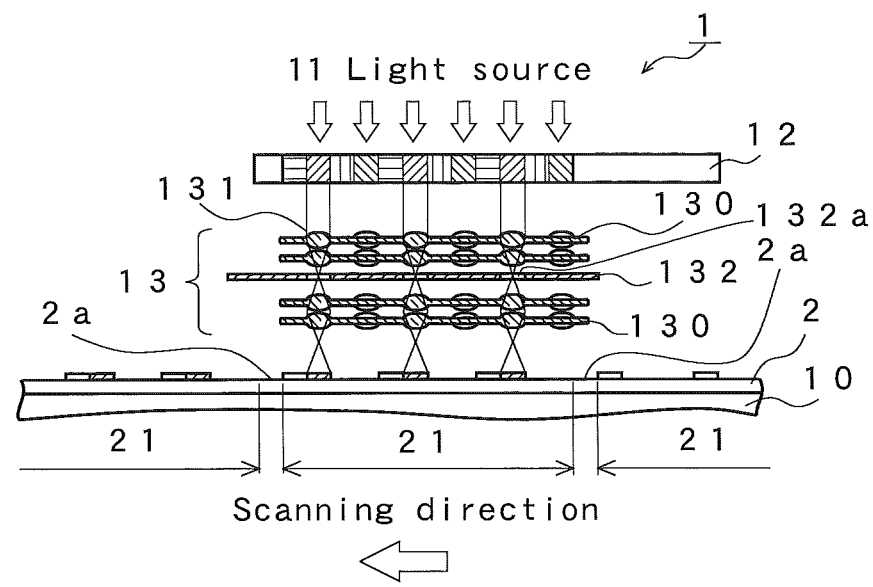
Scanning direction
(a)
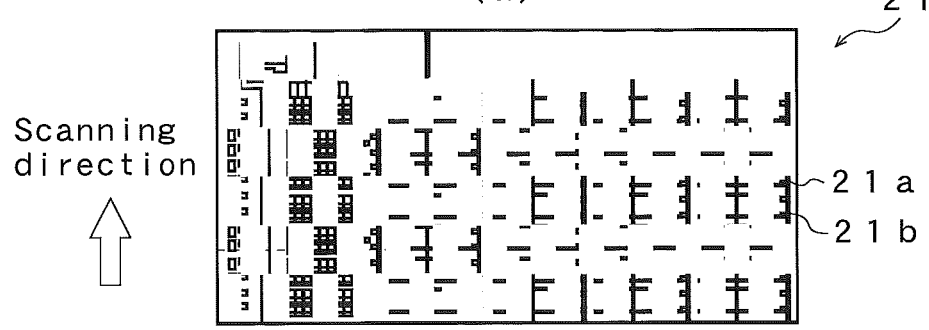
Scanning direction
(b)

(a)

(b)

LIGHT-EXPOSURE DEVICE

TECHNICAL FIELD

The present invention relates to a light-exposure device for exposing glass substrates, or the like, used in liquid crystal display panels, or the like, for mobile telephones, and relates more specifically to a stepper-type light-exposure device for batch-exposing a substrate on which is formed a plurality of regions to become individual substrates, irradiating the substrate with exposure light in a region to become one or a plurality of individual substrates while moving the substrate in one direction.

BACKGROUND ART

Lens-scanning-type, mirror-projection-type, proximity-type, and other types of light-exposure devices are conventionally used, for example, for exposure of glass substrates, or the like, used in large liquid crystal display panels, or the like. Another practice is to introduce light transmitted through a pattern formed on a large mask into a plurality of projection optical systems (multi-lens), resolve images separately on a substrate, and expose a plurality of regions on the substrate through a single exposure. Such a light-exposure method is adopted for exposure of substrates requiring a resolution of 3 μm or larger.

However, when the substrate used is small, for example, such as a glass substrate used in a liquid crystal display, or the like, for a portable telephone, a light-exposure method using a multi-lens such as mentioned above cannot be adopted because a high resolution of 2 μm or smaller is required. A stepper-type light-exposure device used for exposure of semiconductor substrates, or the like, is therefore used (for example, patent documents 1 and 2).

In a stepper-type light-exposure device, light transmitted through each pattern formed on the mask is transmitted to a reduction optical system, and a substrate is then irradiated therewith. A glass substrate used in a liquid crystal display panel, or the like, for a portable telephone is conventionally produced from a large, for example, 1.5 m² substrate, and a plurality of times of exposure is performed for each region to become one or a plurality of individual glass substrates. The substrate on which all regions to become individual substrates were exposed is separated in a later step and a plurality of glass substrates is produced.

Patent document 1: Japanese Patent Application Kokai Publication No. 2006-235515

Patent document 2: PCT International Publication No. 2005/038518

DISCLOSURE OF THE INVENTION

Problems the Invention is Intended to Solve

However, the problems are presented in abovementioned prior art in that in a stepper-type light-exposure device, light transmitted through a pattern is transmitted to a reduction optical system and a substrate is irradiated therewith. Therefore, the scope that can be irradiated with one time of irradiation (1 shot) of exposure light is narrowed, for example, to 130 to 150 mm². Therefore, exposure with the above narrow scope must be iterated, for example, 30 times or more, in order to expose the entire surface of a plurality of regions to become individual substrates on a 1.5 m² substrate, and there is a problem that the time of the exposure cycle is lengthened.

The present invention was contrived in light of such problems, it being an object thereof to provide a light-exposure device with which exposure with high precision and high resolution can be performed with a short exposure cycle time when exposing a substrate on which regions to become a plurality of individual substrates are formed.

Means for Solving the Problems

The light-exposure device according to the present invention comprises: a light source for emitting pulsed laser light; a mask on which a pattern to be exposed is formed; a microlens array on which a plurality of microlenses for resolving an upright equal-magnification image on a substrate is aligned in a first direction, being a horizontal direction, and is provided in a plurality of rows at a prescribed horizontal pitch in a second direction, being a vertical direction; an optical system for guiding the laser light from the light source through the mask to the microlens array; a drive device for moving the substrate in the second direction; a switch device for successively switching a relative positional relationship between the microlens array and the mask in the second direction by the amount of the horizontal pitch of the microlenses; and a controller for controlling the movement of the substrate by the drive device, the switching of the relative positional relationship between the microlens array and the mask by the switch device, and a timing of irradiation with the laser light.

In the abovementioned light-exposure device, for example, the microlens array is used for exposing a plurality of rectangular regions corresponding to a number of microlenses in one time of irradiation with the laser light; the rectangular regions are arranged in checkerboard-square-form positions at a prescribed vertical pitch in the first direction with mutual spacing in the first direction; the regions on a first row are arranged in positions of arrangement at a prescribed vertical pitch being spaced by one or a plurality of positions in the first direction; the regions on a second row adjacent in the second direction to the first row are arranged with the vertical pitch in the first direction in positions corresponding to the positions of the spacing of the regions on the first row; the regions on a third row adjacent in the second direction to the second row are furthermore arranged at the vertical pitch in the first direction in positions corresponding to spacing common to the first row and the second row when such positions are present, or in positions corresponding to the regions on the first row when the positions of common spacing are not present; and regions on rows of latter stages are arranged henceforth likewise for each row, shifting the positions of arrangement in the first direction until spacing between regions common to all rows of the former stages is exhausted, and when the spacing between the regions common to all rows is exhausted, the regions on a plurality of rows are arranged again successively with the regions being arranged in the same positions of arrangement as on the first row in relation to the first direction.

Said microlens array, for example, includes four microlens arrays on which the plurality of microlenses is aligned in a first direction, being a horizontal direction, and is provided in a plurality of rows at a prescribed horizontal pitch in a second direction, being a vertical direction, and a light-blocking member containing a light-blocking material and having a plurality of rectangular light-transmitting parts provided in correspondence with the positions of the microlenses; and the light-blocking member is arranged in a position of resolution of an inverted equal-magnification image between two microlens arrays and two microlens arrays, and is arranged so that the optical axes of the microlenses and light-transmitting parts are unified.

For example, the controller repeats the following procedure so that the exposure pattern of the mask is transferred to the entirety of the exposure region of the substrate: moving the substrate forward in the second direction while maintaining the relative positional relationship between the microlens array and the mask, and exposing the entirety of the exposure region of the substrate; subsequently moving the substrate backward in the second direction and exposing the entirety of the exposure region of the substrate after the relative positional relationship between the microlens array and the mask is switched by being shifted by the amount of the horizontal pitch in the second direction by the switch device; and furthermore moving the substrate forward in the second direction and exposing the entirety of the exposure region of the substrate after the relative positional relationship between the microlens array and the mask is switched by being shifted by the amount of the horizontal pitch in the second direction by the switch device.

For example, a plurality of mask indicators of mask positions are provided at the horizontal pitch in the second direction on the mask; an indicator-detecting microlens used for relative alignment with the mask using the mask indicators is provided on the microlens array; the light-exposure device has a first detector for detecting the mask indicators of the mask positions; and the switching device repeats the following procedure so that the exposure pattern of the mask is transferred to the entirety of the exposure region of the substrate: first, the positional relationship between the mask and the microlens array is fixed in a state in which a first mask indicator of the mask is detected by the indicator-detecting microlens, and in this state the controller moves the substrate forward in the second direction with respect to the microlens array;

next, the positional relationship between the microlens array and the mask is switched so that a second mask indicator shifted by the amount of the horizontal pitch in the second direction from the first mask indicator on the mask is detected by the indicator-detecting microlens, whereupon that positional relationship is fixed, in which state the controller moves the substrate backward in the second direction with respect to the microlens array; and subsequently, the positional relationship between the microlens array and the mask is switched so that a third mask indicator shifted by the amount of the horizontal pitch in the second direction from the second mask indicator on the mask is detected by the indicator-detecting microlens, whereupon that positional relationship is fixed, in which state the controller moves the substrate forward in the second direction with respect to the microlens array.

For example, a configuration is possible such that: individual exposure regions corresponding to individual substrates to be obtained are arranged in the second direction on the substrate, and substrate indicators for detecting a substrate position are provided between the individual exposure regions; the light-exposure device has a second detector for detecting the substrate indicator and detecting the position in the second direction of the substrate; and the controller performs a control so that laser light is emitted from the light source and pulse exposure is performed when a substrate position is detected by the second detector.

In this case, the controller can move the substrate at a constant speed in the second direction using the drive device; and can control so that laser light is emitted from the light source and pulse exposure is performed when the substrate indicator is detected by the second detector.

Alternatively, the controller can control movement of the substrate iteratively, using the drive device, during low-speed movement when the substrate is irradiated with laser light, during high-speed movement when exposure is not performed, and during acceleration or deceleration between the low-speed movement and the high-speed movement; and can control so that laser light is emitted from the light source and pulse exposure is performed at a specific point in time during a period when the substrate indicator can be detected by the second detector, the period being a period during the low-speed movement or proximal thereto during the acceleration or deceleration.

A configuration is also possible further comprising: a third detector for detecting a position of the mask in the first direction; a fourth detector for detecting a position of the substrate in the first direction; and a mask position controller for correcting positions of the mask and the microlens array in the first direction when the position of the mask in the first direction is shifted from a prescribed position with respect to the substrate based on a result of detection by the third detector and the fourth detector.

Effects of the Invention

According to the present invention, an exposure pattern of a mask is exposed on the surface of a substrate as an upright equal-magnification image, and pulsed exposure is iterated while moving the substrate, whereby all regions to be exposed on the substrate are exposed; and another region of the exposure pattern of the mask is then exposed while moving the substrate shifting the positional relationship between the microlens array and the mask by the amount of the horizontal pitch. Thus, the entire area of the exposure pattern of the mask can be exposed and transferred to the substrate by continuing to expose the entire area of the exposure region, shifting the microlens array and the mask by the amount of the horizontal pitch. Because the resolution of the microlens array is high, a high-resolution image can be exposed on the substrate with a short exposure cycle time without using a stepper.

BRIEF DESCRIPTION OF THE DRAWINGS

FIG. 1 (*a*) is a side view illustrating the arrangement of the light source, mask, and microlens array in the light-invention, exposure device according to an embodiment of the present and (*b*) is a plan view illustrating a substrate;

FIG. 2 (*a*) is a plan view illustrating the mask of the light-exposure device according to an embodiment of the present invention, and (*b*) is a plan view illustrating a microlens array of the same;

FIG. 6 (*a*) is a side view illustrating the step for forming a first exposure region in the light-exposure device according to an embodiment of the present invention, and (*b*) is a diagram illustrating an exposure region formed on a substrate as a region to become one individual substrate;

FIG. 8 (a) is a side view illustrating the step for forming a second exposure region in the light-exposure device according to an embodiment of the present invention, and (b) is a diagram illustrating an exposure region formed on a substrate as a region to become one individual substrate;

BEST MODE FOR CARRYING OUT THE INVENTION

Figure 3:
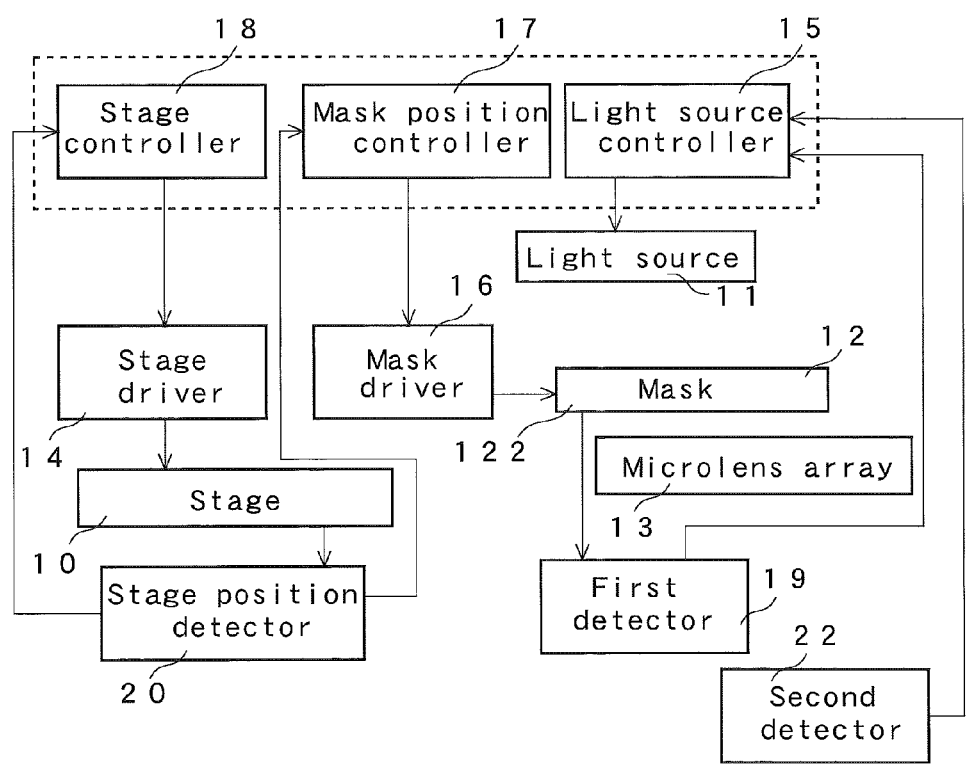
FIG. 3 is a block diagram illustrating the configuration of the light-exposure device according to an embodiment of the present invention.

An embodiment of the present invention is described specifically below while referring to the attached drawings. FIG. 1 (a) is a side view illustrating the arrangement of the light source, mask, and microlens array in the light-exposure device according to an embodiment of the present invention, and FIG. 1 (b) is a plan view illustrating a substrate. FIG. 2 (a) is a plan view illustrating the mask of the light-exposure device according to the embodiment of the present invention, and FIG. 2 (b) is a plan view illustrating the microlens array of the same. FIG. 3 is a block diagram illustrating the configuration of the light-exposure device according to the embodiment of the present invention. As illustrated in FIG. 1, the light-exposure device 1 of the present embodiment comprises: a stage 10 on which a substrate 2 to be exposed is mounted; a light source 11 for exposure light, being pulsed laser light; a mask 12 provided with a pattern 122 that is projected on a region to become an individual substrate of the substrate 2 as exposure light from the light source 11 is introduced; and a microlens array 13 on which the exposure light transmitted through the pattern 122 is introduced to resolve an image of the pattern 122 as an upright equal-magnification image on the substrate 2. The light-exposure device is provided with an optical system, for example, total reflection mirrors, or the like, for guiding the laser light from the light source 11 through the mask 12 to the microlens array 13. As illustrated in FIG. 1, the stage 10 is configured to be movable back and forth in one direction by a stage driver 14, and the stage 10 is moved by the stage driver 14, whereby the substrate 2 mounted on the stage 10 is conveyed. In the present embodiment, the stage driver 14 moves the stage 10 and the substrate 2 at a constant speed in the scanning direction (second direction) in FIG. 1.

The substrate 2 to be exposed is, for example, a 1.5 m² member containing a glass substrate material, and, as illustrated in FIG. 1 (b), regions 21 to become individual glass substrates are provided in a plurality of places being aligned in the scanning direction (hereinafter referred to also as "second direction") and a direction perpendicular thereto (hereinafter referred to also as "first direction"). These regions to become glass substrates may be provided to be adjacent to each other, and may be provided being separated by a suitable length, but in the present embodiment, as illustrated in FIG. 1 (b), a plurality of regions 21 to become individual substrates is provided following the second direction on the substrate 2, and the regions 21 to become individual substrates are provided separated by a suitable length in the second direction. In the present embodiment, N-shaped marks 2a (substrate indicators) are provided between the regions 21 to become individual substrates, and the timing of emission of laser light from the light source 11 is determined by detecting the marks 2a by a line CCD or other detector 22 (second detector) provided on the light-exposure device while the substrate 2 is moved in the second direction. For example, the line CCD as the detector 22 is arranged to extend in the direction (first direction) perpendicular to the scanning direction below the substrate 2, and a light source controller to be described performs a control so that exposure light being pulsed laser light is emitted from the light source 11 when the fact that the center of the diagonal edge of the N-shaped marks 2a passed above is detected by the line CCD.

The light source 11 of the present embodiment is a light source for emitting laser light, for example, including ultraviolet light, and is a light source for emitting laser light at short pulse width of about 5 nsec to 7 nsec per cycle. A light source controller 15 is provided on the light-exposure device 1, and emission of exposure light from the light source 11 is controlled by the light source controller 15. For example, the light source controller 15 is connected to the detector 22, and controls the timing of emission of exposure light from the light source 11 based on a result of detection by the detector 22, or performs a control so that exposure light is not emitted from the light source 11 when the position of the mask 12, microlens array 13, or substrate 2 is shifted from a prescribed position. The pulsed laser light emitted from the light source 11 is irradiated to the mask 12.

As illustrated in FIG. 2 (a), the mask 12 is provided, for example, with a pattern formation area 121 in the center of a frame 120, and the pattern 122 that is projected on the region 21 to become an individual substrate as the pulsed laser light emitted from the light source 11 is introduced is provided in the center of the pattern formation area 121. The frame 120 is supported, for example, by a support member not illustrated, and the support member is moved following the second direction by a mask driver 16, whereby the mask 12 is moved following the second direction. The movement of the mask 12 by the mask driver 16 is controlled, for example, by a mask position controller 17.

In the present embodiment, the region where the pattern 122 is provided is formed to match the size of a glass substrate to be used in a liquid crystal display, for example, for a personal digital assistant (PDA), smartphone, or other portable terminal; for example, the region where the pattern is provided is provided to be equal to or slightly longer than the length of the region to become one individual substrate, the length in the second direction parallel to the scanning direction of the substrate 2 being, for example, about 100 mm. The region where the pattern 122 is provided is also provided to be equal to or slightly longer than the width of the region to become one individual substrate, the width in the first direction perpendicular to the scanning direction being about 100 mm. The size and use of the glass substrate in the present embodiment are one example; the present invention is not limited to exposure in the case of producing a member for such use, and can be applied widely for exposure in the case of producing members requiring high resolution.

As illustrated in FIG. 2 (a), for example, a plurality of cross-shaped mask indicators 123 is provided on side portions of the pattern formation area 121 in the first direction on the mask 12, and the mask indicators 123 are provided being aligned in the second direction. The distance between mask indicators 123 in the second direction is equal to the distance, for example, between microlenses 131 in the second direction of the microlens array 13 to be described. In the present embodiment, the mask indicators 123 are provided as indicators 123a to 123d, four each, on both side portions of the pattern formation area 121. As shall be described in more detail below, the mask indicators 123 are used for determining whether or not the position of the mask 12 is in a prescribed positional relationship relative to the microlens array 13 on being detected by a CCD camera or other first detector 19 when forming an exposure region of a first layer on the substrate 2. When the mask 123 is detected by the first detector 19, the light source controller 15 connected to the light source 11 controls so that exposure light is emitted from the light source 11 at a prescribed timing.

As illustrated in FIG. 2 (a), slits 124 are provided on the pattern formation area 121 of the mask 12, and an N-shape is formed by two slits extending in the second direction and one slit provided diagonally to the first direction so as to join the ends on mutually opposite sides of the two slits. The slits 124 are used for alignment of the mask position when forming exposure regions of second and further layers on the substrate 2.

The microlens array 13 is configured with one light-blocking member 132 and four microlens units 130, and as illustrated in FIG. 1, two microlens units 130 are arranged above the light-blocking member 132, and the other two microlens units 130 are arranged below the light-blocking member 132. The exposure light transmitted through the pattern 122 of the mask 12 is introduced through the optical system, for example, total reflection mirrors, or the like, to the upper two microlens units 130, and an image is resolved as an inverted equal-magnification image. The light-blocking member 132 is provided in the position where this inverted equal-magnification image is resolved, the exposure light transmitted through light-transmitting parts provided on the light-blocking member 132 is introduced to the lower two microlens units 130, and an upright equal-magnification image is resolved on the substrate 2.

The light-blocking member 132 is a member containing a light-blocking material, for example, chromium, or the like, and a plurality of rectangular openings 132a of the light-transmitting parts 132a is provided in the center thereof. The rectangular openings 132a are arranged with the following regularity. That is, the plurality of openings 132a is arranged in checkerboard-form positions at a prescribed vertical pitch in the first direction with mutual spacing in the first direction; the rectangular regions on a first row are arranged in positions of arrangement at a prescribed vertical pitch being spaced by one or a plurality of positions in the first direction; the rectangular regions on a second row adjacent in the second direction to the first row are arranged with the same vertical pitch as on the first row in the first direction in positions corresponding to the positions of the spacing of the rectangular regions on the first row; the rectangular regions on a third row adjacent in the second direction to the second row are furthermore arranged with the same vertical pitch as on the first row in the first direction in positions corresponding to spacing common to the first row and second row when such positions are present, or in positions corresponding to the rectangular regions on the first row when the positions of common spacing are not present; and regions on rows of latter stages are arranged henceforth likewise for each row, shifting the positions of arrangement in the first direction until spacing between regions common to all rows of the former stages is exhausted, and when the spacing between the regions common to all rows is exhausted, the rectangular regions on a plurality of rows are arranged again successively with the rectangular regions being arranged in the same positions of arrangement as on the first row in relation to the first direction.

In the present embodiment, as illustrated in FIG. 2 (b), the rectangular openings 132a form arrays following the first direction perpendicular to the scanning direction of the substrate 2, and a plurality of arrays of openings 132a is provided following the second direction. The arrays of openings 132a adjacent in the second direction are provided so as to be separated by the length of an opening 132a in the second direction. Each array of openings 132a is provided so that the position in the second direction is shifted between adjacent arrays. That is, each opening 132a and a light-blocking area between openings 132a on an adjacent array are provided to be aligned in the second direction, and the plurality of openings 132a is provided in zigzag form following the first direction across two adjacent arrays. Therefore, in the present embodiment, openings 132a aligned in the second direction are provided separated by the length of four openings 132a. The mask 12 in the present embodiment is configured to be movable in the second direction, and therefore the region irradiated on the microlens array 13 with the light transmitted through the pattern 122 also moves in the second direction accompanying movement of the mask 12. In the present embodiment, the length of the light-blocking member 132 is provided to be larger than the total movable range of the region irradiated with the light transmitted through the mask 12. Therefore, the substrate 2 is irradiated only with the exposure light transmitted to the microlens array 13.

The four microlens units 130 has a material containing a light-transmitting material, for example, quartz, or the like, protruding upward and downward at prescribed positions, and this protruding portion constitutes a microlens 131. The plurality of microlenses 131 is arranged so as to correspond with the openings 132a of the light-blocking member 132.

Figure 4:
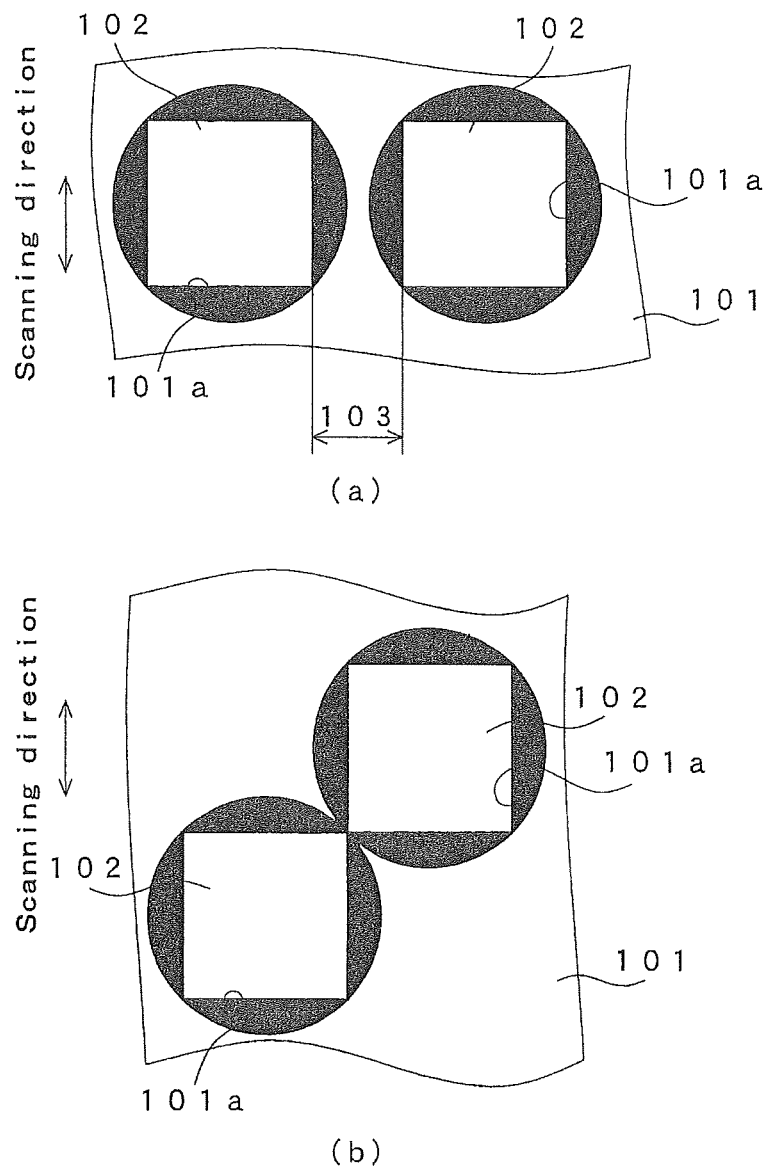
FIG. 4 (*a*) and (*b*) are diagrams illustrating one example of arrangement of the microlenses.

FIGS. 4 (a) and 4 (b) are diagrams illustrating one example of the arrangement of the microlenses and the light-blocking member. As illustrated in FIG. 4, each microlens 102 has, for example, a circular or ellipsoidal shape in plan view. Therefore, when rectangular exposure light is transmitted to each microlens 102, the size of a rectangular opening 101a provided in a light-blocking member 101 is largest in the case of a rectangular shape inscribed in the circular or ellipsoidal shape of the projected microlens 102 in plan view. Therefore, as illustrated in FIG. 4 (a), when the microlenses 102 are provided so as to be aligned in the direction perpendicular to the scanning direction of the substrate, the exposure light is not transmitted through the regions 103 between the openings 101a. In the case of FIG. 4 (b) where microlenses 102 are arranged most proximally, while the microlenses 102 are arranged with no gap in the first direction, a region where the exposure light is not transmitted actually appears in the region between the openings 101a due to the curvature or other effect of the convex lenses, and lap marks appear in the boundary portion of the exposure region formed on the substrate.

In the present embodiment, as illustrated in FIG. 2 (b), the microlenses 131 and the openings 132a of the light-blocking member are arranged so as to be separated by suitable lengths in the second direction, being the scanning direction of the substrate 2, and in the first direction perpendicular thereto, and are arranged so that there is no spacing between regions common to all rows in the second direction. The appearance of lap marks between exposure regions as in the arrangement illustrated in FIG. 4 can be prevented by performing exposure successively, switching the relative positional relationship between the microlens array and the mask in the second direction by the horizontal pitch.

As illustrated in FIG. 2 (b), in the present embodiment, rectangular openings 132b are provided also on side portions of the light-blocking member 132 in the first direction; for example, microlenses are provided also in the positions corresponding to the openings 132b in the microlens array 130. The spacing of the openings 132b in the second direction is arranged to be the same as the spacing of the mask indicators 123. In the light-exposure device 1, a (first) detector 19, for example, a CCD camera, or the like, is also provided below the opening 132b, and is configured to be able to detect the mask indicators 123 through the openings 132b. That is, when the positional relationship between the mask 12 and the microlens array 13 is in a prescribed positional relationship during exposure, the mask indicator 123 is detected by the first detector 19 through the opening 132b, and the fact that the relative positional relationship between the mask 12 and the microlens array 13 is detected. The first detector 19 is connected to light source controller 15. When the mask indicator 123 is detected by the first detector 19, the light source controller 15 performs a control so that exposure light is emitted from the light source 11 at a prescribed timing while the substrate 2 is being conveyed; and when the mask indicator 123 cannot be detected by the first detector 19, the light source controller determines that the position of the mask 12 or the microlens array 13 is shifted, and performs a control so that exposure light is not emitted.

By this, when the indicator 123 was detected by the first detector 19 through the opening 132b, exposure light is emitted at a prescribed timing from the light source 11, the light transmitted through the mask 12 is introduced to the two microlens units 132 arranged above the microlens array 13, and an inverted equal-magnification image is resolved in the position of the light-blocking member 132. The exposure light is transmitted in a rectangular shape by the opening 132a of the light-blocking member 132, and is transmitted to each microlens 131 of the microlens unit 130 arranged below the light-blocking member 132. An upright equal-magnification image is resolved in the position of the substrate 2.

In the present embodiment, the exposure steps are divided for each relative position of the mask 12 relative to the microlens array 13 during total-surface exposure of the substrate 2. That is, the substrate 2 is moved in the scanning direction while one relative positional relationship of the mask 12 to the microlens array 13 is maintained, and when the substrate 2 reaches a prescribed position, exposure light of pulsed laser light is emitted from the light source 11, and formation of one exposure region is completed instantaneously by irradiation with one time of exposure light for a region 21 to become one individual substrate. This is iterated, whereby prescribed regions are exposed for all of the regions 21 to become individual substrates. The mask 12 is then moved by the mask driver 16, and the relative position of the mask 12 relative to the microlens array 13 is changed. The next exposure region is formed while the stage 10 is moved backward by the stage driver 14. This is iterated four times successively. By this, in the present embodiment, the entire surface can be exposed by irradiation with four times of exposure light for the region 21 to become one individual substrate, and the exposure cycle time is very short.

In the present embodiment, only the case in which the exposure cycle time is divided into four times, but the same effect as in the present embodiment can be obtained even in the case in which the exposure cycle time is divided into five or more times.

The operation of the light-exposure device of the present embodiment is next described. In the present embodiment, an exposure region of one layer is formed on the substrate 2 by the light-exposure device 1. FIGS. 5 to 12 are diagrams illustrating the order of steps of exposure by the light-exposure device according to the embodiment of the present invention; FIGS. 5, 7, 9, and 11 are diagrams illustrating the positional relationship between the mask and the microlens array when successively forming an exposure region of a first layer on a substrate; and FIGS. 6, 8, 10, and 12 are diagrams illustrating each exposure step and the exposure region formed thereby on the substrate for a region to become one individual substrate.

When starting to perform exposure using the light-exposure device 1, first, the substrate 2 is mounted in a prescribed position on the stage 10, and the position on the substrate 2 in the first and second directions, and the like, are adjusted as needed.

Once the substrate 2 is set in the prescribed position on the stage 10, the stage 10 is moved at a constant speed in the second direction, being the scanning direction, by the stage driver 14. By this, the substrate 2 mounted on the stage 10 is moved in the second direction at a constant speed together with the stage 10, and is conveyed below the microlens array 13. The mask position controller 17 first performs a control so that the mask 12 is moved by the mask driver 16, and the relative position of the mask 12 relative to the microlens array 13 is set to a first position. In the description below, "first through fourth positions" refers to the case in which the relative positional relationship of the mask 12 relative to the microlens array 13 is in a prescribed positional relationship during exposure and there is no shift.

Figure 5:
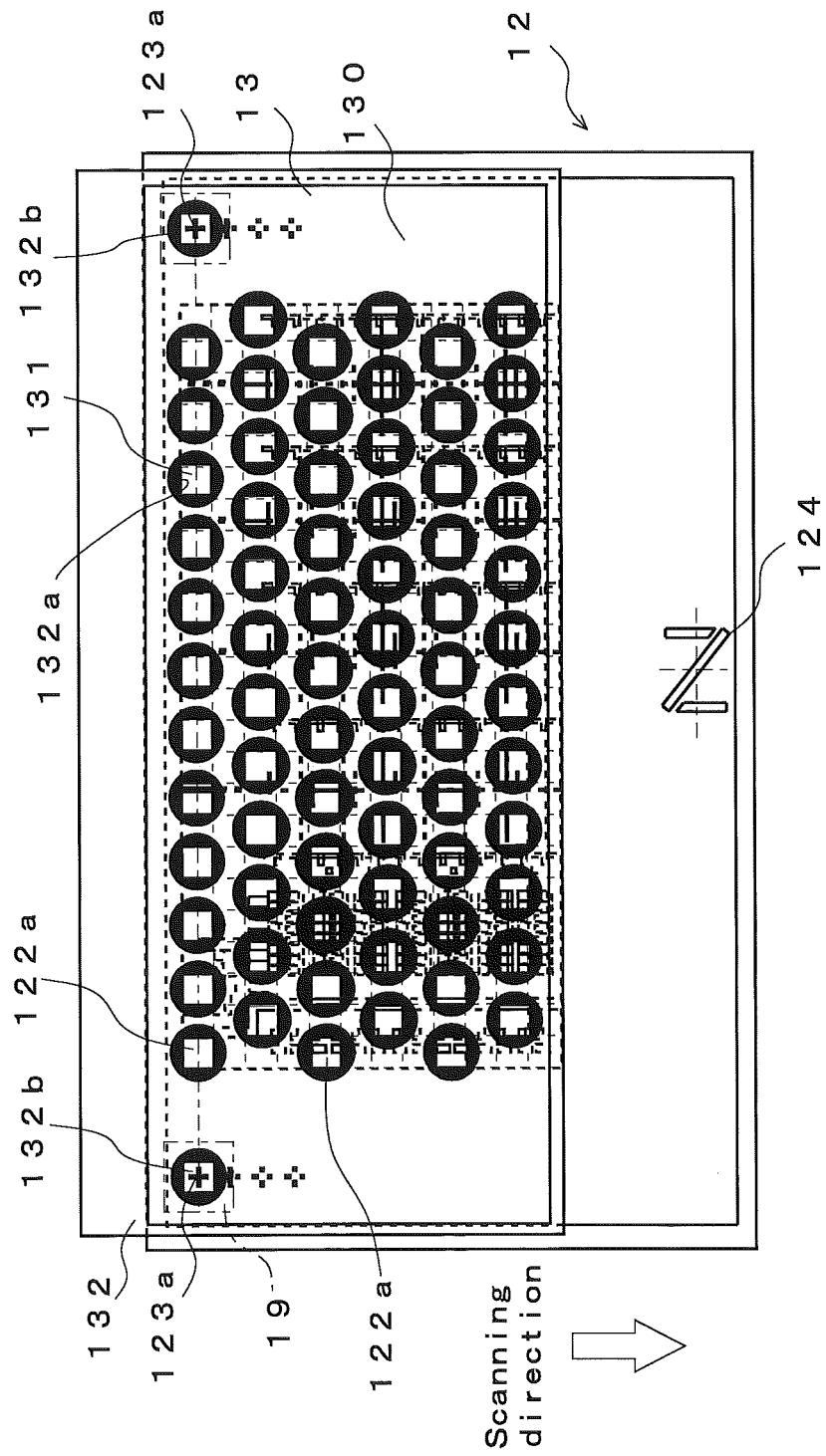
FIG. 5 is a diagram illustrating the positional relationship between the mask and the microlens array when forming a first exposure region on a substrate in the light-exposure device according to an embodiment of the present invention.

Whether the mask 12 was moved to the prescribed position relative to the microlens array 13 is confirmed by the position of the cross-shaped indicator 123a provided corresponding to the first position among the four mask indicators 123 on one side. That is, when the relative position of the mask 12 relative to the microlens array 13 is in the prescribed position, as illustrated in FIG. 5, the indicator 123a provided corresponding to the first position is in a position that can be observed from the opening 132b of the microlens array 13, and this can be detected by the first detector 19. However, when the relative position of the mask 12 relative to the microlens array 13 is shifted from the prescribed position, the indicator 123a cannot be detected by the first detector 19. In this case, the first detector 19 sends to the light source controller 15 a signal that the indicator 123a could not be detected. The light source controller 15 performs a control so that exposure light is not emitted from the light source 11 on the basis of the signal sent from the first detector 19.

The position of the substrate 2 is known based on the positions of the marks 2a provided corresponding respectively to the regions 21 to become individual substrates. In the present embodiment, as illustrated in FIG. 1 (b), a line CCD or other (second) detector 22 is arranged so as to extend in the first direction below the substrate 2, and, for example, a diagonal edge of N-shaped marks 2a is detected by this detector 22. That is, the position where the diagonal edge of the marks 2a passes above the line CCD continues to move in the first direction accompanying movement of the substrate 2 toward the second direction. Thus, the position of the exposure region of the substrate 2 can be known correctly if the position where the marks 2a pass in the first direction is detected by the detector 22. For example, the position for irradiation with exposure light can be aligned with good precision relative to the position of the region to be exposed if exposure light being pulse laser light is emitted from the light source 11 when the fact that the center of the diagonal edge of the marks 2a passed above the line CCD is detected. As auxiliary means for ascertaining the position of the substrate 2, for example, a configuration is possible such that a plurality of indicators is provided on the stage 10 and the indicators are detected by an encoder or other stage position detector 20.

The exposure light emitted from the light source 11 is introduced through an optical system, for example, total reflection mirrors, or the like, to the entire surface of the pattern 122 of the mask 12, and is transmitted through the pattern 122. The exposure light transmitted through the pattern 122 first is introduced to the two microlens units 130 above the microlens array 13. An inverted equal-magnification image of the pattern 122 is resolved in the position of the light-blocking member 132. As illustrated in FIG. 5, because a plurality of openings 132a is provided separated by suitable lengths in the first and second directions on the light-blocking member 132 and the light-blocking member 132 is configured with chromium or other light-blocking material, as illustrated in FIG. 6 (a), only the light transmitted through the openings 132a is introduced to the lower two microlens units 130. The exposure light transmitted to the two microlens units 130 is resolved as an upright equal-magnification image on the regions 21 to become individual substrates of the substrate 2. By this, as illustrated in FIG. 6 (b), first exposure regions 21a are formed so as to correspond to the arrangement of the openings 132a on the regions 21 to become individual substrates.

Movement of the stage 10 is continued within a margin of error of resolving power required for the first exposure regions 21a even when irradiating with exposure light in the first position. For example, when the margin of error of resolution of the first exposure regions 21a in the second direction is held to 0.1 μm or lower, and when the pulse width of the exposure light is 1 μsec, the movement speed of the stage 10 is set to 100 mm/second.

Thus, the regions 21 to become individual substrates are batch exposed, movement of the stage 10 is then continued, and the regions 21 to become individual substrates adjacent in the second direction being the scanning direction are finally conveyed below the microlens array 13. In this case as well, just as above, the light source controller 15 performs a control so that exposure light being pulse laser light is emitted from the light source 11 when the fact that the center of the diagonal edge of the marks 2a passed above the line CCD is detected. By this, just as in the above case, first exposure regions 21a are first formed so as to correspond to the arrangement of the openings 132a above the regions 21 to become individual substrates. The above steps are iterated, whereby first exposure regions 21a of prescribed regions are formed with good precision on all of the regions 21 to become individual substrates of the substrate 2.

Figure 7:
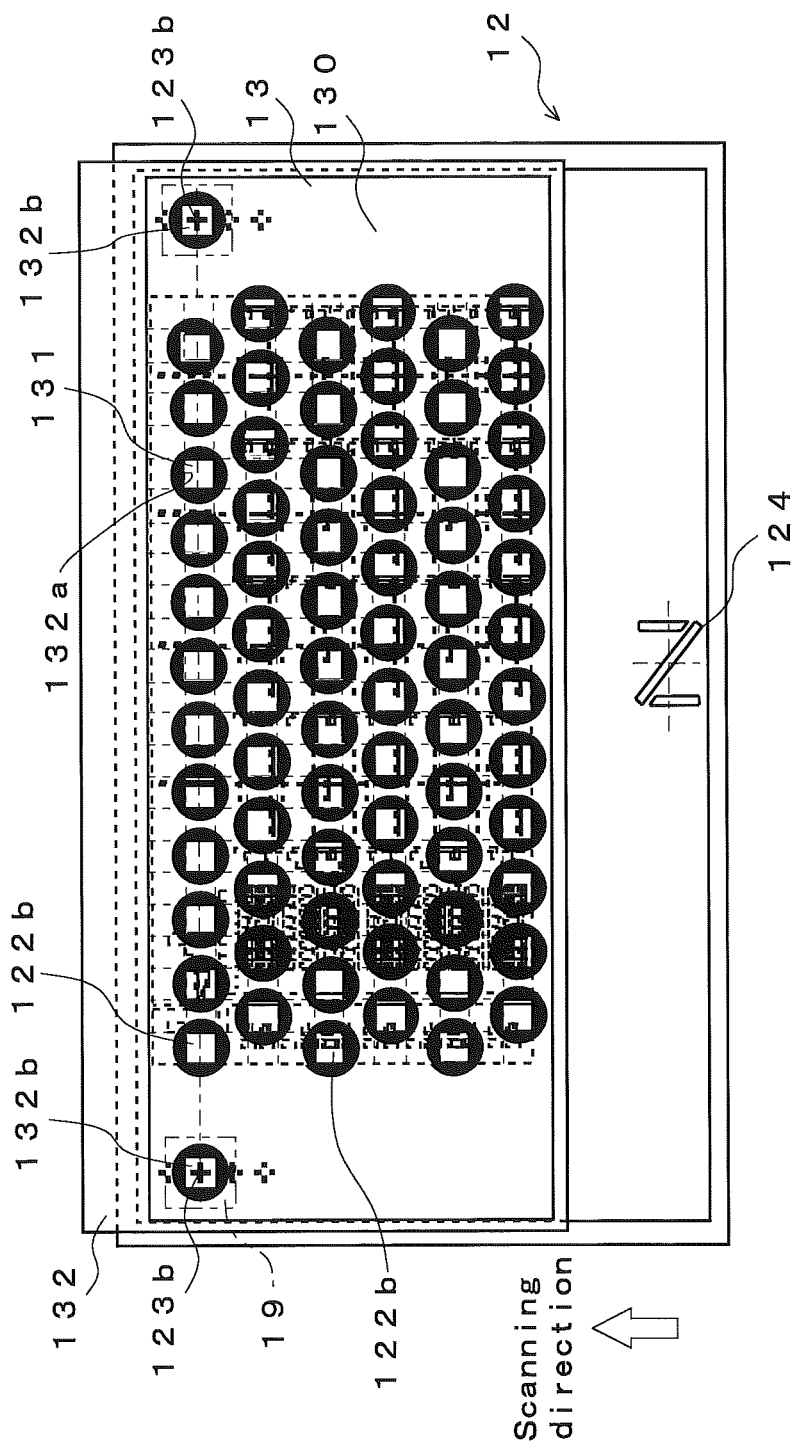
FIG. 7 is a diagram illustrating the positional relationship between the mask and the microlens array when forming a second exposure region on a substrate in the light-exposure device according to an embodiment of the present invention.

The mask position controller 17 next performs a control so that the mask 12 is moved by the mask driver 16, and the relative position of the mask 12 relative to the microlens array 13 is set to the second position. In the present embodiment, the distance of movement from the first position to the second position is the horizontal pitch of the microlenses 131 in the second direction. Whether the mask 12 was moved to the prescribed position is confirmed by the position of the cross-shaped indicator 123b provided corresponding to the second position. That is, when the relative position of the mask 12 relative to the microlens array 13 is in the prescribed position, as illustrated in FIG. 7, the indicator 123b provided corresponding to the second position is in a position that can be observed from the opening 132b of the microlens array 13, and this can be detected by the first detector 19. However, when the relative position of the mask 12 relative to the microlens array 13 is shifted from the prescribed position, the indicator 123b cannot be detected by the first detector 19. In this case, the first detector 19 sends to the light source controller 15 a signal that the indicator 123b could not be detected. The light source controller 15 performs a control so that exposure light is not emitted from the light source 11 on the basis of the signal sent from the first detector 19.

In the second position, as illustrated in FIG. 8 (a), the stage driver 14 moves the stage 10 in the reverse direction to that in the case of the first position. During exposure in the second direction also, the position of the substrate 2 is known based on the positions of the marks 2a provided adjacent to the regions 21 to become individual substrates. That is, the diagonal edge of the N-shaped marks 2a is detected by a line CCD or other (second) detector 22 provided below the substrate 2. Thus, the position where the marks 2a passed in the first direction is detected by the detector 22, whereby the position of the exposure region of the substrate 2 can be known correctly. When the relative position of the mask 12 relative to the microlens array 13 is in the second position, the region irradiated with exposure light is shifted by the horizontal pitch in the second direction. Therefore, in the second position, the exposure light being pulse laser light is emitted from the light source 11 when the fact that the portion shifted by a prescribed pitch in the first direction from the center position in the diagonal edge of the marks 2a passed above the line CCD is detected.

The exposure light emitted from the light source 11 is introduced through an optical system, for example, total reflection mirrors, or the like, to the entire surface of the pattern 122 of the mask 12, is transmitted through the pattern 122, and is introduced to the two microlens units 130 above the microlens array 13. An inverted equal-magnification image of the pattern 122 is resolved in the position of the light-blocking member 132. As illustrated in FIG. 7, because a plurality of openings 132a is provided separated by suitable lengths in the first and second directions on the light-blocking member 132 and the light-blocking member 132 is configured with chromium or other light-blocking material, as illustrated in FIG. 8 (a), only the light transmitted through the openings 132a is introduced to the lower two microlens units 130, and the exposure light transmitted to the two microlens units 130 is resolved as an upright equal-magnification image on the regions 21 to become individual substrates of the substrate 2. By this, as illustrated in FIG. 8 (b), second exposure regions 21b are formed so as to correspond to the arrangement of the openings 132a in the region 21a adjacent to the first exposure regions 21a on the regions 21 to become individual substrates.

Thus, the regions 21 to become individual substrates are exposed, the stage 10 is then moved at a constant speed, and the next regions 21 to become individual substrates adjacent in the second direction being the scanning direction are finally conveyed below the microlens array 13. The light source controller 15 performs a control so that exposure light being pulse laser light is emitted from the light source 11 when the fact that the prescribed portion of the diagonal edge of the marks 2a passed above the line CCD is detected. Second exposure regions 21b are formed so as to correspond to the arrangement of the openings 132a above the regions 21 to become individual substrates. The above steps are iterated, whereby second exposure regions 21b of prescribed regions are formed with good precision on all of the regions 21 to become individual substrates.

Figure 9:
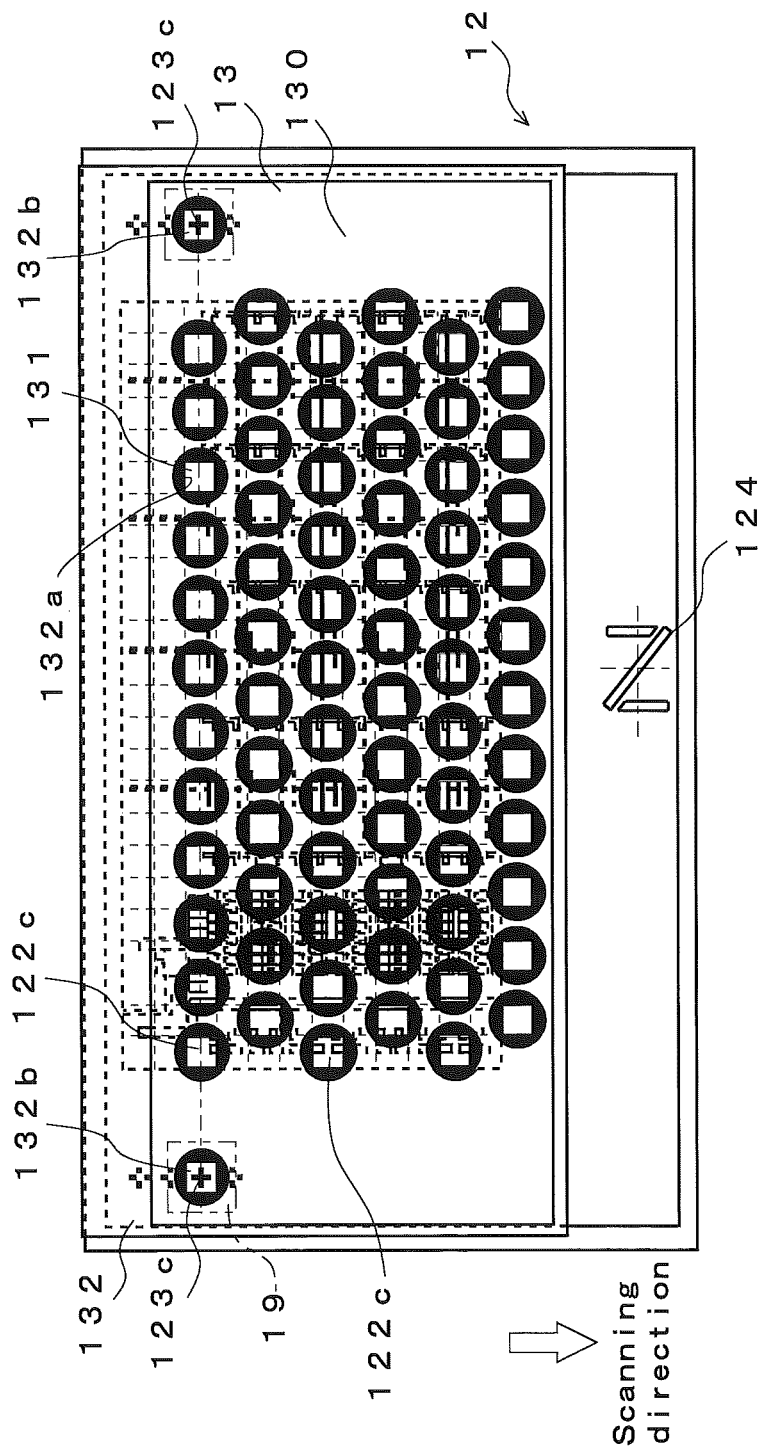
FIG. 9 is a diagram illustrating the positional relationship between the mask and the microlens array when forming a third exposure region on a substrate in the light-exposure device according to an embodiment of the present invention.
Figure 10:
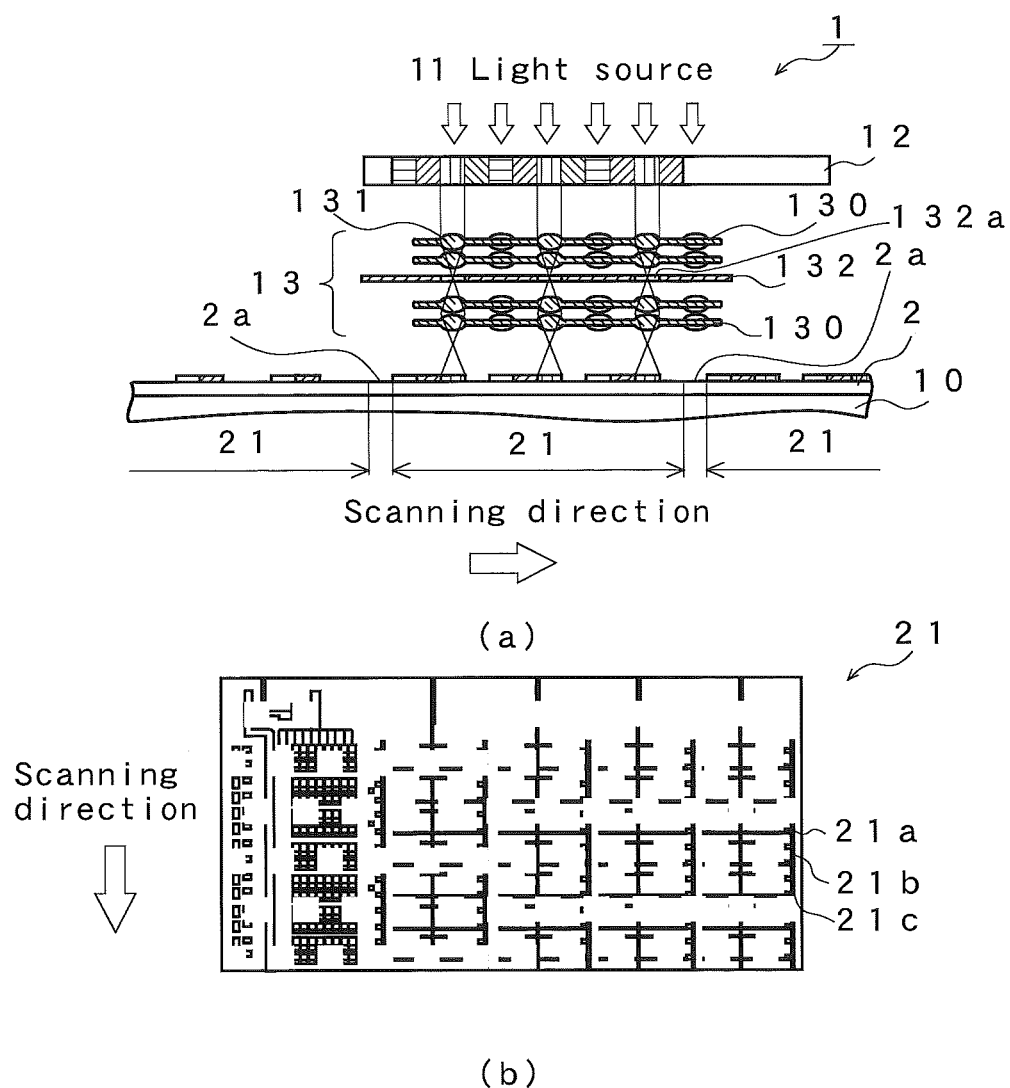
FIG. 10 (a) is a side view illustrating the step for forming a third exposure region in the light-exposure device according to an embodiment of the present invention, and (b) is a diagram illustrating an exposure region formed on a substrate as a region to become one individual substrate.
Figure 11:
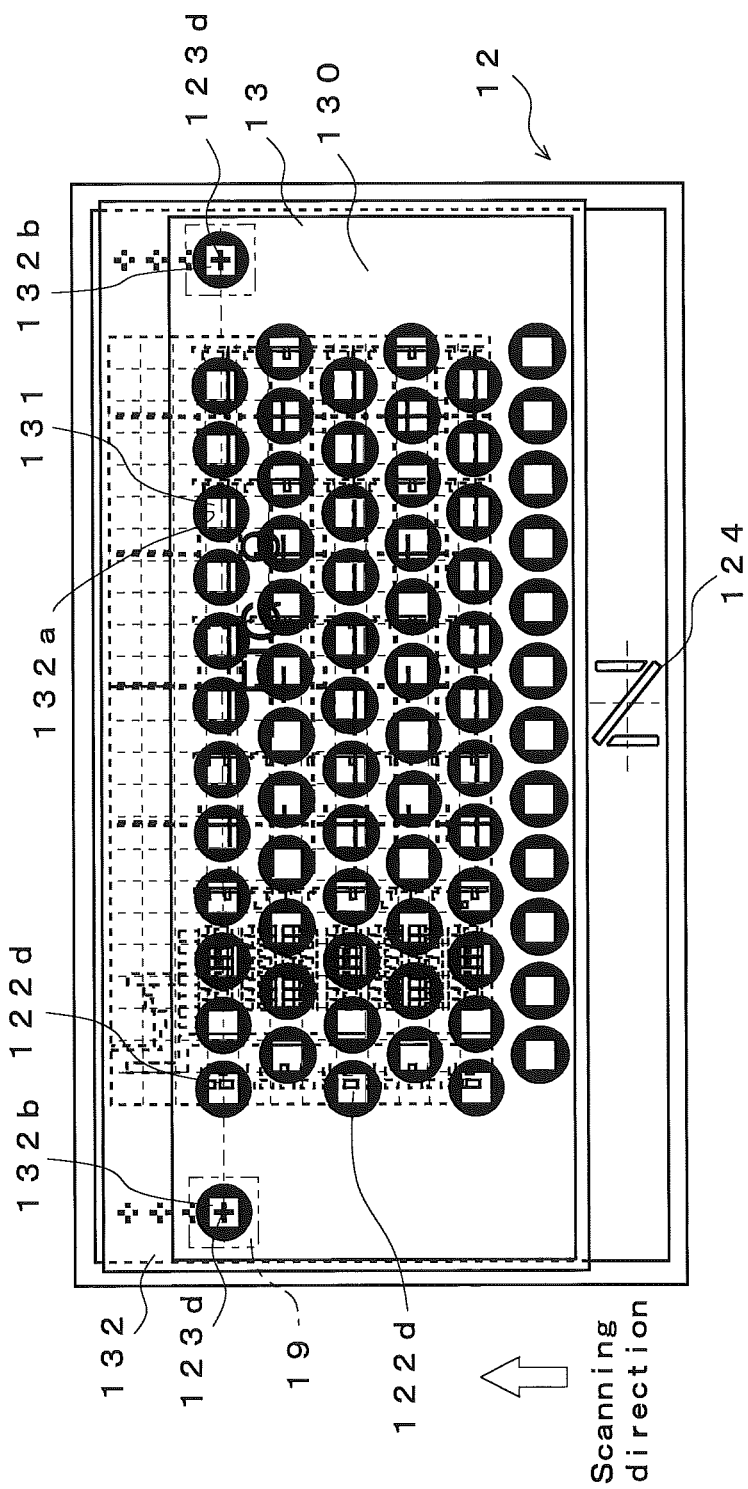
FIG. 11 is a diagram illustrating the positional relationship between the mask and the microlens array when forming a fourth exposure region on a substrate in the light-exposure device according to an embodiment of the present invention.
Figure 12:
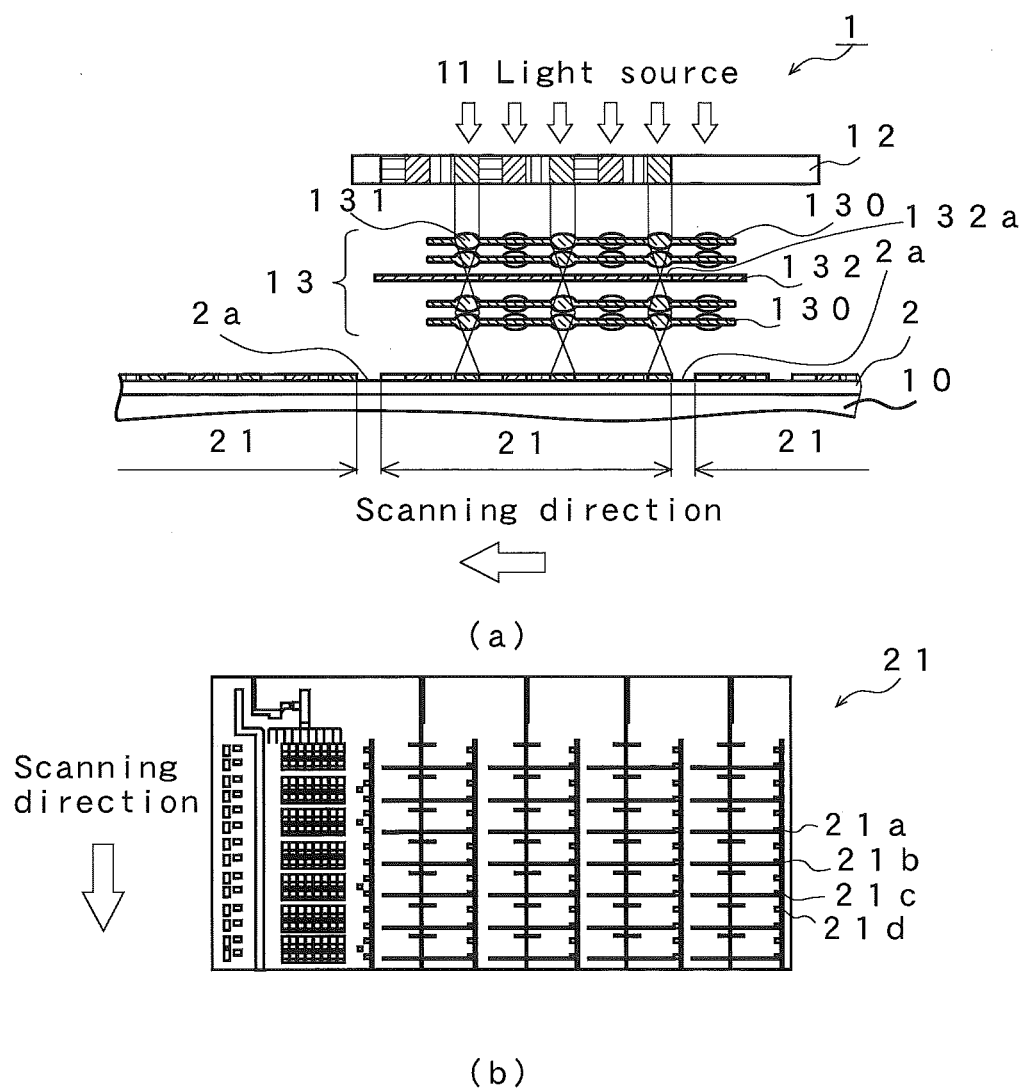
FIG. 12 (a) is a side view illustrating the step for forming a fourth exposure region in the light-exposure device according to an embodiment of the present invention, and (b) is a diagram illustrating an exposure region formed on a substrate as a region to become one individual substrate.

Movement of the mask 12, inversion in the direction of movement of the stage 10, and step exposure are henceforth likewise iterated, whereby third exposure regions 21c are formed so as to be adjacent to the second exposure regions 21b as illustrated in FIGS. 9 and 10, and fourth exposure regions 21d are formed so as to be adjacent to the third exposure regions 21c as illustrated in FIGS. 11 and 12. In the present embodiment, the microlenses 131 of the microlens array 13 and the openings 132a of the light-blocking member are arranged so that there is no spacing between regions common to all rows in the second direction. Therefore, exposure with high precision becomes possible without appearance of lap marks in boundaries between exposure regions. Because exposure is performed successively, shifting the relative positional relationship between the microlens array and the mask in the second direction by the horizontal pitch, the entire surface of the regions 21 to become individual substrates is exposed by four times of exposure.

With the light-exposure device of the present embodiment as above, the exposure pattern 122 of the mask 12 is exposed on the surface of the substrate 2 as an upright equal-magnification image by the microlens array 13; at this time, the substrate 2 is moved and pulsed exposure is iterated, whereby all regions to be exposed on the substrate 2 are exposed; the positional relationship between the microlens array 13 and the mask 12 is then shifted by the horizontal pitch, and other regions of the exposure pattern of the mask are exposed while moving the substrate. Thus, the microlens array 13 and the mask 12 are shifted by the horizontal pitch and the entire area of the exposure region is exposed, whereby the entire area of the exposure pattern 122 of the mask 12 can be exposed and transferred to the substrate 2.

In the present embodiment, the microlens array 13 is used for resolving an image of the exposure pattern 122. Because the resolving power of the microlens array is high, a high-resolution image can be exposed on a substrate with a short exposure cycle time without using a stepper.

In the present embodiment, a case was described in which one sheet of regions 21 to become individual substrates is formed in the first direction, but the same effect as in the present embodiment can be obtained, even in the case in which a plurality of regions 21 to become individual substrates is formed in the first direction, if the mask 12 and the microlens array 13 are provided being aligned to the size of the plurality of regions 21.

Figure 13:
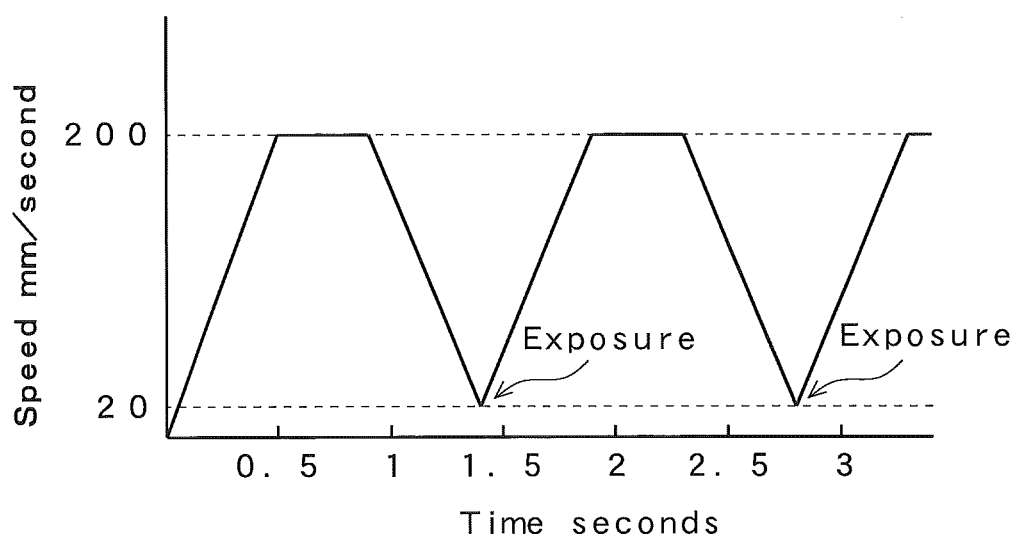
FIG. 13 is a graph illustrating movement speeds of stages in the light-exposure device according to a second embodiment of the present invention.

The light-exposure device according to a second embodiment of the present invention is next described. In the light-exposure device according to the first embodiment, the stage 10 and the substrate 2 were moved at a constant speed in the second direction by the stage driver 14, but in the light-exposure device according to the present embodiment, the speed of movement in the second direction of the stage 10 and the substrate 2 by the stage driver 14 is suitably changed, whereby the exposure cycle time can be further shortened. FIG. 13 is a graph illustrating the movement speeds of the stage in the light-exposure device according to the present second embodiment. The stage 10 is moved after one time of irradiation with exposure light, and only the substrate 2 is conveyed without a requirement to emit exposure light until the next region to be exposed reaches a prescribed position for irradiation with exposure light. Therefore, the exposure cycle time can be shortened by increasing the speed of movement of the stage 10 and shortening the movement time until the next region to be exposed approaches the position to be irradiated with exposure light to a certain extent. For example, the movement speed of the stage 10 can be increased to about 200 mm/second as illustrated in FIG. 13. For example, in the example illustrated in FIG. 13, 9.5 seconds are required just during the time of movement when one exposure region to the next prescribed region for irradiation are separated by a pitch of 190 mm and this distance is traversed at a constant speed of 20 mm/second as in the first embodiment, but the distance of 190 mm can be traversed in 1.4 seconds by accelerating the stage 10 as in the present embodiment.

In this case, a prescribed threshold is preferably provided for the movement speed of the stage 10 and the substrate 2, and the movement speed of the stage 10 and the substrate 2 is preferably suitably changed. That is, it can be imagined that an exposure region may be formed exceeding the allowable error of resolving power required for exposure when the substrate 2 is moved at high speed. The threshold of the movement speed of the stage 10 and the substrate 2 is changed in accordance with the allowable error of resolving power required for exposure, but for example, when the margin of allowable error of resolving power is set to 0.2 μm when forming an exposure region having a length of 2 μm in the second direction, the movement speed of the stage 10 during irradiation with exposure light is set to 20 mm/second.

The movement speed is changed, for example, in accordance with the distance between the position for irradiation with exposure light and the prescribed region for exposure on the substrate 2. In this case, the configuration is such that, for example, a line CCD or other detector of a type that extends in two directions is provided in the light-exposure device, and N-shaped marks 2a provided so as to correspond respectively to the regions 21 to become individual substrates are detected following the second direction. The movement speed of the stage 10 is set to the prescribed threshold or higher when the prescribed region for exposure of the substrate 2 is separated by at least a prescribed distance from the position for irradiation with exposure light based on the result of detection by the line CCD extending in the second direction, and the stage 10 is decelerated when the prescribed region for exposure of the substrate 2 approaches the prescribed distance to the position for irradiation with exposure light, whereby the movement speed is controlled so that the movement speed of the stage 10 when the prescribed region for exposure reaches the prescribed position for irradiation with exposure light will be at or below the threshold. In the example illustrated in FIG. 13, the stage controller 18 accelerates the stage 10 after one exposure region is formed, and sets the movement speed of the stage 0.5 seconds later from the start of acceleration to 200 mm/second. The movement speed of the stage 10 is maintained for 0.4 seconds. By this, the distance until the next exposure region reaches the prescribed position for irradiation with exposure light becomes 40 mm. The stage controller 18 decelerates the stage 10 once the prescribed region for exposure of the substrate 2 approaches this point, and the movement speed of the stage 10 when the next region to be exposed reaches the prescribed position for irradiation with exposure light 0.5 seconds later is set to 20 mm/second.

The timing of emission of exposure light is controlled by the light source controller 15. That is, the light source controller 15 performs a control so that pulse laser light is emitted from the light source 11 at the instant that the region prescribed for exposure reaches the region of image resolution of light transmitted through the microlens array 13 based on the result of detection by the second detector 22. That is, the timing of emission of exposure light is determined on the basis of the position of the N-shaped marks 2a in the second direction. By this, each exposure region can be formed with good precision within the margin of allowable error of resolution required for exposure.

In the present embodiment as above, the exposure cycle time can be greatly shortened by increasing the movement speed of the stage 10 and the substrate 2 as needed, and high-resolution exposure is possible by changing the movement speed in accordance with the distance between the prescribed region for exposure and the prescribed position for irradiation with exposure light.

In the light-exposure device of the present embodiment, the detector 22 may be connected to the stage controller 18, and the precision of exposure is further improved if the configuration is such that the movement speed of the stage 10 can be feedback controlled based on the result of detection by the detector 22.

Figure 14:
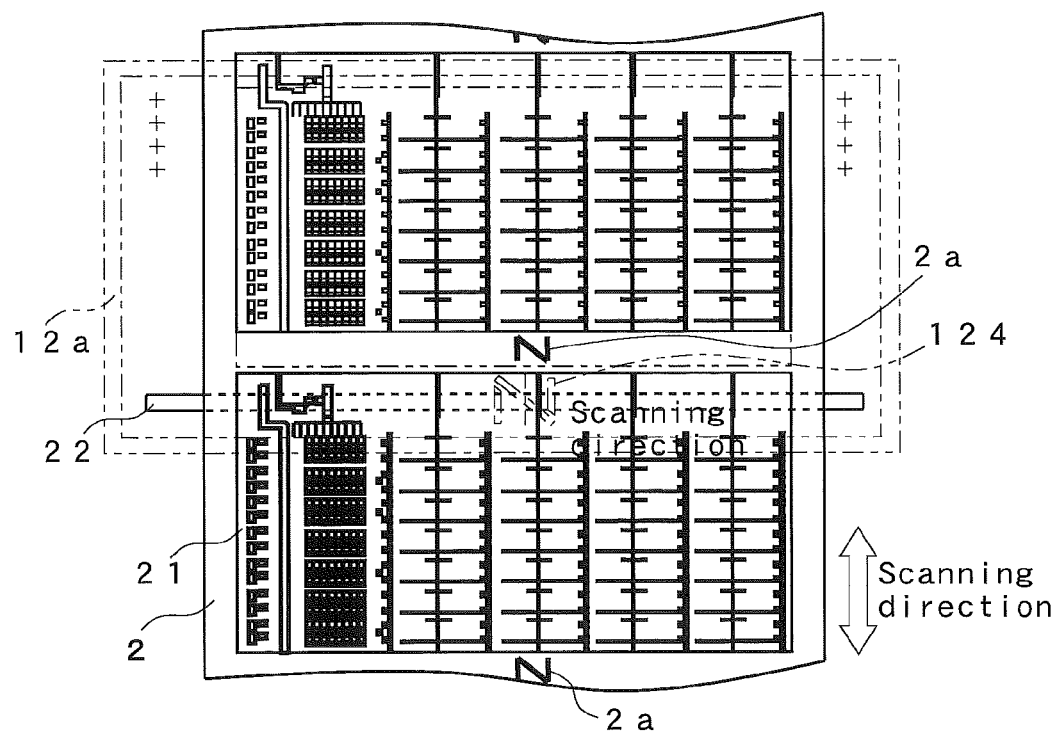
FIG. 14 is a diagram illustrating light-exposure devices according to third and fourth embodiments of the present invention.

The light-exposure device according to a third embodiment of the present invention is next described. In the present embodiment, in the light-exposure device according to the first embodiment, the light-exposure device is provided with a mask 12a on which is formed an exposure pattern of a second or further layer as illustrated in FIG. 14. In the present embodiment as well, a line CCD or other detector 22 provided so as to extend in the first direction detects N-shaped marks 2a formed so as to correspond to the regions 21 to become substrates when forming the exposure region of the second or further layer, and the light source controller 15 performs a control so that exposure light being pulse laser light is emitted from the light source 11 at a prescribed timing based on the result of detection by the detector 22.

In the case in which exposure of the second or further layer is performed on the substrate 2 as in the present embodiment, the timing of emission of exposure light is determined by using the same substrate indicator as in exposure of the first layer, whereby the formed exposure region of the second or further layer matches in all layers without shifting of relative position relative to the exposure region of the first layer. Therefore, high precision of exposure can be maintained particularly in the second direction.

In the present embodiment as well, the exposure cycle time can be appreciably improved in exposure of the second or further layer by changing the movement speed of the stage 10 and the substrate 2 as needed in the same manner as in the second embodiment.

The light-exposure device according to a fourth embodiment of the present invention is next described. In the present embodiment, the configuration in the light-exposure device illustrated in FIG. 14 is such that a line CCD or other detector 22 extending in the first direction is capable of detecting also a position in the first direction with respect to N-shaped marks 2a provided corresponding respectively to the regions 21 to become individual substrates. That is, in the present embodiment, the detector 22 detects the position of the regions 21 to become individual substrates in the first direction by detecting the center position between the two sides extending in the second direction of the mark 2a. Likewise, the configuration is such that the detector 22 is capable of detecting the center position in the first direction also with respect to the N-shaped slits 124 in the mask 12a. The configuration is such that when forming a pattern of a second or further layer, for example, when the position of the slits 124 detected by the line CCD is shifted relative to the regions 21 to become individual substrates, the positions of the mask 12a and the microlens array 13 can be corrected by the amount of the shift in the first direction.

In the case in which a plurality of patterns are transferred to the substrate 2, cases can be imagined in which the mask is exchanged, the substrate 2 is moved in a zigzag manner in the first direction accompanying conveyance, or the like. However, high precision of exposure can be assuredly maintained in the first direction, even in the case in which a pattern of a second or further layer is formed, by correcting the positions of the mask and the microlens array 13 based on the marks 2a formed on the sub substrate 2 as in the present embodiment.

In the present embodiment, a case was described in which a detector for detecting the position of the substrate 2 in the first direction and a line sensor or other detector 22 for detecting the position of the mask 12a are provided only in one place, but detectors 22 may be provided separately so as to correspond with the respective directions.

INDUSTRIAL APPLICABILITY

The present invention is advantageous as a light-exposure device for producing small, high-resolution liquid crystal display panels, or the like, for portable telephones.

KEY

1: light-exposure device
11: light source
12: mask
13: microlens array
14: stage driver
15: light source controller
16: mask driver
17: mask position controller
18: stage controller
19: first detector
20: stage position detector
21: region to become substrate
22: detector

What is claimed is:

1. A light-exposure device, comprising:
a light source for emitting pulsed laser light;
a mask on which a pattern to be exposed is formed;
a microlens array on which a plurality of microlenses for resolving an upright equal-magnification image on a substrate is aligned in a first direction, being a horizontal direction, and is provided in a plurality of rows at a prescribed horizontal pitch in a second direction, being a vertical direction;
an optical system for guiding the laser light from said light source through said mask to said microlens array;
a drive device for moving said substrate in said second direction relative to said mask and said microlens array;
a switch device for shifting and successively switching a relative positional relationship between said microlens array and said mask in said second direction by an amount of said horizontal pitch of said microlenses; and
a controller for controlling the movement of said substrate by said drive device, the switching of the relative positional relationship between said microlens array and said mask by said switch device, and a timing of irradiation with said laser light,
wherein said controller successively repeats the following procedures so that the exposure pattern of said mask is transferred to an entirety of the exposure region of said substrate:

the positional relationship between said microlens array and said mask is set by said switch device as a first relationship, whereupon said substrate is moved in said second direction by said drive device, and when each of a plurality of individual exposure regions on the substrate is facing the mask position, exposure light is irradiated from said light source to produce a one-shot exposure;

the relative positional relationship between the microlens array and the mask is then shifted by said switch device in said second direction by an amount commensurate to said horizontal pitch of said microlenses and set as a second relationship, whereupon said substrate is moved by said drive device in a direction opposite of said second direction, and when each of a plurality of individual exposure regions on the substrate is facing the mask position, exposure light is irradiated from said light source to produce the one-shot exposure; and the positional relationship between the microlens array and the mask is then shifted by said switch device in said second direction in an amount commensurate to said horizontal pitch of said microlenses and set as a third relationship, whereupon said substrate is moved by said drive device in said second direction, and when each of a plurality of individual exposure regions on the substrate is facing the mask position, exposure light is irradiated from said light source to produce the one-shot exposure.

2. The light-exposure device according to claim 1, wherein:

said microlens array is used for exposing a plurality of rectangular regions corresponding to a number of microlenses in one time of irradiation with said laser light;

said rectangular regions are arranged in checkerboard-square-form positions at a prescribed vertical pitch in the first direction with mutual spacing in the first direction;

said regions on a first row are arranged in positions of arrangement at a prescribed vertical pitch being spaced by one or a plurality of positions in said first direction;

said regions on a second row adjacent in the second direction to said first row are arranged with said vertical pitch in said first direction in positions corresponding to the positions of said spacing of the regions on said first row;

said regions on a third row adjacent in the second direction to said second row are furthermore arranged at said vertical pitch in said first direction in positions corresponding to spacing common to said first row and said second row when such positions are present, or in positions corresponding to said regions on said first row when said positions of common spacing are not present; and regions on rows of latter stages are arranged henceforth likewise for each row, shifting the positions of arrangement in said first direction until spacing between regions common to all rows of former stages is exhausted, and when the spacing between the regions common to all rows is exhausted, said regions on a plurality of rows are arranged again successively with said regions being arranged in the same positions of arrangement as on the first row in relation to the first direction.

3. The light-exposure device according to claim 1, wherein said microlens array includes four microlens arrays on which said plurality of microlenses is aligned in a first direction, being a horizontal direction, and is provided in a plurality of rows at a prescribed horizontal pitch in a second direction, being a vertical direction, and a light-blocking member comprising a light-blocking material and including a plurality of rectangular light-transmitting parts provided in correspondence with the positions of said microlenses, and wherein said light-blocking member is arranged in a position of resolution of an inverted equal-magnification image between two microlens arrays and two microlens arrays, and is arranged so that the optical axes of the microlenses and light-transmitting parts are unified.

4. The light-exposure device according to claim 1, wherein:

a plurality of mask indicators of mask positions are provided at said horizontal pitch in said second direction on said mask;

an indicator-detecting microlens used for relative alignment with said mask using said mask indicators is provided on said microlens array;

said light-exposure device has a first detector for detecting said mask indicators of said mask positions; and said switching device repeats the following steps so that the exposure pattern of said mask is transferred to the entirety of the exposure region of said substrate:

first, the positional relationship between said mask and said microlens array is fixed in a state in which a first mask indicator of said mask is detected by said indicator-detecting microlens, and in this state said controller moves said substrate forward in the second direction with respect to said microlens array;

next, the positional relationship between said microlens array and said mask is switched so that a second mask indicator shifted by the amount of the horizontal pitch in the second direction from said first mask indicator on said mask is detected by said indicator-detecting microlens, whereupon that positional relationship is fixed, in which state said controller moves said substrate backward in the second direction with respect to said microlens array; and subsequently, the positional relationship between said microlens array and said mask is switched so that a third mask indicator shifted by the amount of the horizontal pitch in the second direction from said second mask indicator on said mask is detected by said indicator-detecting microlens, whereupon that positional relationship is fixed, in which state said controller moves said substrate forward in the second direction with respect to said microlens array.

5. The light-exposure device according to claim 1, wherein individual exposure regions corresponding to individual substrates to be obtained are arranged in the second direction on said substrate, and substrate indicators for detecting a substrate position are provided between said individual exposure regions, wherein said light-exposure device includes a second detector for detecting said substrate indicator and detecting the position in the second direction of said substrate, and wherein said controller performs a control so that laser light is emitted from said light source and pulse exposure is performed when a substrate position is detected by said second detector.

6. The light-exposure device according to claim 5, wherein:

said controller moves said substrate at a constant speed in said second direction using said drive device; and laser light is emitted from said light source and pulse exposure is performed when said substrate indicator is detected by said second detector.

7. The light-exposure device according to claim 5, wherein said controller controls movement of said substrate iteratively, using said drive device, during low-speed movement when said substrate is irradiated with laser light, during high-speed movement when exposure is not performed, and during acceleration or deceleration between said low-speed movement and said high-speed movement, and
wherein laser light is emitted from said light source and pulse exposure is performed at a specific point in time during a period when said substrate indicator is detectable by said second detector, the period being a period during said low-speed movement or proximal thereto during said acceleration or deceleration.

8. The light-exposure device according to claim 1, further comprising:
a detector for detecting a position of said mask in said first direction;
another detector for detecting a position of said substrate in said first direction; and
a mask position controller for correcting positions of said mask and said microlens array in said first direction when the position of said mask in said first direction is shifted from a prescribed position with respect to said substrate, based on a result of detection by said detector and said another detector.

9. The light-exposure device according to claim 1, wherein the controller is configured to maintain the positional relationship between said microlens array and said mask such that the substrate is moved forward in the second direction while maintaining the relative positional relationship between the microlens array and the mask to expose the entirety of the exposure region of the substrate.

10. The light-exposure device according to claim 9, wherein, after setting the second relationship, the controller is further configured to move the substrate backward in the second direction and to expose the entirety of the exposure region of the substrate.

11. The light-exposure device according to claim 10, wherein, after setting the third relationship, the controller is further configured to move the substrate forward in the second direction and to expose the entirety of the exposure region of the substrate.

12. The light-exposure device according to claim 1, wherein the second direction includes a direction of scanning performed by the drive device when the substrate is exposed via the microlenses and the mask.

13. The light-exposure device according to claim 1, wherein the controller is configured such that, during switching the relative positional relationship between the microlens array and the mask, the microlens array is not shifted relative to a substrate of an object to be exposed.

14. The light-exposure device according to claim 1, wherein a distance by which the microlens array is moved relative to the mask in order for the switch device to perform switching includes the horizontal pitch of the microlenses.

15. The light-exposure device according to claim 1, wherein a movement of the substrate by the drive device is reciprocal.

16. The light-exposure device according to claim 1, wherein a movement of the substrate by the drive device is successively repeating by going forward and backward in the second direction.

* * * * *